(12) United States Patent
Yoshida

(10) Patent No.: US 6,403,284 B1
(45) Date of Patent: *Jun. 11, 2002

(54) PROCESS FOR PRODUCING PHOTOSENSITIVE RESIN PRINTING PLATE AND TREATING SOLUTION

(75) Inventor: Masahiro Yoshida, Fuji (JP)

(73) Assignee: Asahi Kasei Kogyo Kabushiki Kaisha, Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/029,575

(22) PCT Filed: Dec. 5, 1997

(86) PCT No.: PCT/JP97/04456
§ 371 (c)(1),
(2), (4) Date: Mar. 6, 1998

(87) PCT Pub. No.: WO98/25184
PCT Pub. Date: Jun. 11, 1998

(30) Foreign Application Priority Data

Dec. 6, 1996 (JP) .............................................. 8-340406

(51) Int. Cl.⁷ .................................................. G03F 7/40
(52) U.S. Cl. ...................... 430/309; 430/331; 430/306; 430/328; 252/600
(58) Field of Search ................................. 430/309, 331, 430/306, 328; 252/600

(56) References Cited

U.S. PATENT DOCUMENTS

| | | | | |
|---|---|---|---|---|
| 4,202,696 A | | 5/1980 | Takahashi et al. | 430/306 |
| 4,603,058 A | * | 7/1986 | Adams | 427/54.1 |
| 4,861,916 A | * | 8/1989 | Köhler et al. | 522/40 X |
| 5,168,087 A | * | 12/1992 | Li Bassi et al. | 502/164 |
| 5,856,066 A | * | 1/1999 | Yoshida et al. | 430/309 |

FOREIGN PATENT DOCUMENTS

| | | |
|---|---|---|
| EP | 0791 859 A2 | 8/1997 |
| JP | 56-161182 | 4/1981 |
| WO | 86/02177 | 4/1986 |

OTHER PUBLICATIONS

Muror, Steven, *Handbook of Photochemistry*, Marcel Dekker, Inc, New York, NY, 1973, p. 23.*

* cited by examiner

*Primary Examiner*—Cynthia Hamilton
(74) *Attorney, Agent, or Firm*—Birch, Stewart, Kolasch & Birch, LLP

(57) ABSTRACT

A surface-treating solution for a photosensitive resin printing plate which comprises an aqueous surface active agent solution and a hydrogen-abstracting agent which can abstract a hydrogen atom of a compound upon irradiation with an active radiation which hydrogen-abstracting agent is uniformly dispersed in the aqueous surface active agent solution.

14 Claims, No Drawings

PROCESS FOR PRODUCING PHOTOSENSITIVE RESIN PRINTING PLATE AND TREATING SOLUTION

This application claims the benefit under 35 U.S.C. §371 of prior PCT International Application No. PCT/JP97/04456 which has an International filing date of Dec. 5, 1997 which designated the United States of America, the entire contents of which are hereby incorporated by references.

TECHNICAL FIELD

This invention relates to a surface-treating solution for a photosensitive resin printing plate which solution comprises a hydrogen-abstracting agent and to a process for producing a photosensitive resin printing plate which is broadly used as a printing plate for letterpress printing in which process the above surface-treating solution is used (said process is referred to as a plate-making process or plate-making in some cases hereinafter).

BACKGROUND ART

A photosensitive resin printing plate is generally obtained by an exposure step in which only the photosensitive layer of a relief portion is cured by a radical polymerization reaction caused by irradiation with active radiation and a development step subsequent to the exposure step, in which the uncured resin in other portions than the relief portion is dissolved in and removed with a given washing solution (developer) or swollen with and dispersed in the washing solution and then removed mechanically, thereby allowing only the cured portion to appear as a relief on the plate surface.

In general, with a photosensitive resin which is cured by a radical polymerization reaction, a vanishment reaction of a radical active species is caused competitively with its propagation reaction. Hence when the reaction rate is increased to heighten the sensitivity of the resin, it becomes difficult to increase the degree of polymerization which is governed by the concentration of an initiator. In order to obtain a relief suitable for printing, and in order to obtain the necessary sensitivity (reaction rate) for efficiently and simply carrying out the plate-making work, it is necessary for the photosensitive resin to contain a given amount of an initiator. However, there is a limit in the degree of polymerization of resin and hence unreacted substance remains even after the resin has been cured, whereby the resulting printing plate surface is tacky.

The production of a photosensitive resin printing plate is generally carried out in four steps of exposure, development, post-exposure and drying. The post-exposure is a step of further irradiating the printing plate with an active radiation in order to cure the unreacted substance present in and on the cured plate obtained after the development, to thereby increase the mechanical strength of the printing plate and reduce the surface tackiness of the printing plate. However, the printing plate even after the post-exposure step is not necessarily sufficiently freed of the surface tackiness.

When a printing plate having a great amount of tackiness is used in printing, there are such problems as poor workability during attaching the plate to and detaching the plate from a plate cylinder; adhesion of plates to each other or attachment of dust to the plates during the storing of the plates; adhesion of paper powder to the plate and paper-picking during the printing; and the like. In particular, when paper powder adhesion and the paper-picking result from the tackiness of the plate during the printing, it is necessary to discontinue the printing and clean the plate, such that working efficiency is remarkably decreased.

As a method of solving problems as mentioned above, there has been adopted a method in which the polymerization of the surface of the cured product of a photosensitive resin is accelerated by immersing the photosensitive resin cured product in a liquid and irradiating the same with an active radiation in the post-exposure step (referred to hereinafter as the post-exposure-in-water method, and in comparison therewith, the post-exposure in the atmosphere is referred to hereinafter as the post-exposure-in-air method) or by effecting the post-exposure in an inert gas; a method in which a coating material such as a rubber latex, a saran latex or the like is coated on the photosensitive resin printing plate to lower the surface tackiness; a method in which an oxidizing agent and a reducing agent are used alone or in admixture to subject the photosensitive resin printing plate to chemical treatment; a method in which the above methods are combined; or the like. As a kind of coating method, there is proposed to utilize a surface tackiness-removing method which, when a higher fatty acid, a higher alcohol or the like is incorporated into the photosensitive resin composition, the said compound is deposited as crystals on the surface of the photosensitive resin printing plate after the plate-making (JP-A-61-120,142).

However, these methods are insufficient in the effect per se, or even though they have any effect, the ease of handling of the reagents used becomes a problem in some cases. Specifically, the following problems are mentioned: (1) The coating method is disadvantageous in that the coating layer is peeled off during the printing, and is insufficient in the maintainability of the effect. (2) With some kinds of photosensitive resin compositions, even when the post-exposure is effected in an atmosphere from which oxygen is excluded such as in a liquid or in an inert gas (referred to hereinafter as poor oxygen post-exposure), the tackiness removal is insufficient in some cases. (3) In the treatment method using an oxidizing agent and a reducing agent, in general, it is necessary to pay attention to the handling of the reagents used and it becomes necessary to subject the apparatus contacting the treating solution to rust prevention processing.

In particular, the poor oxygen post-exposure of (2) is a method in which it is intended that the oxygen be excluded to allow the radical polymerization of the polymerizable double bond in the composition to be efficiently effected, whereby the prepolymer is three-dimensionally cross-linked, the mechanical strength is increased and simultaneously therewith the presence of the unreacted (namely uncross-linked) prepolymer is diminished as much as possible to reduce the tackiness. However, when the photosensitive resin contains a large amount of such a prepolymer that the number of polymerizable double bonds in one molecule is 2 or less, it is confirmed that the mechanical strength of the printing plate obtained from the photosensitive resin is increased by the oxygen-lacking post-exposure, but the tackiness-removal effect is insufficient. Moreover, when the photosensitive resin contains a large amount of such a prepolymer that the number of polymerizable double bonds exceeds 2, it is necessary for the printing plate obtained from the said photosensitive resin to be irradiated with an active radiation for a very long time in order to achieve a sufficient tackiness-removing effect.

That is to say, in the plate-making process at present, it is difficult to allow all the terminal double bonds of the prepolymer to react, and even if all of them should have reacted, a plate quite free of tackiness would not be obtained in many cases. Accordingly, in order to more sufficiently remove the surface tackiness of a printing plate produced from the photosensitive resin composition containing such a prepolymer, it is effective to three-dimensionally cross-link the prepolymer by using the polymerization reaction of the polymerizable double bonds in combination with other methods.

As the three-dimensional cross-linking by other reactions than the reaction of double bonds, JP-B-56-16,182 discloses a method which comprises abstracting hydrogen of the main chain of a prepolymer which has reacted with the unreacted monomer or another prepolymer at the terminal double bonds, thereby producing a radical of the prepolymer, and then cross-linking the main chains of the prepolymers with one another through the reaction of the said radicals. Specifically, the surface layer of a radically polymerizable resin cured product is impregnated with a hydrogen-abstracting agent which can abstract a hydrogen atom in a compound upon irradiation with an active radiation and thereafter the impregnated portion of the cured product is irradiated with an active radiation having a wavelength of 300 nm or less, preferably 200 to 300 nm, thereby removing the surface tackiness of the radically polymerizable resin cured product.

JP-B-56-16,182 illustrates, as a specific procedure of a method of impregnating the surface layer of the radically polymerizable resin cured product with a hydrogen-abstracting agent, the dissolution of the hydrogen-abstracting agent in ethanol, isopropanol or a water/ethanol (1/4) mixture and the immersion of the cured product in the resulting solution or the spraying of the surface of the resin cured product with the same solution by a spray.

Furthermore, in order to utilize the removal of the surface tackiness by this method in a process for producing a photosensitive resin plate, (1) the plate obtained by a general process for producing a photosensitive resin plate consisting of exposure, development, post-exposure and drying may be subjected to the hydrogen-abstracting agent-impregnating treatment with the above-mentioned treating solution, and subsequently to irradiation with an active radiation having a wavelength range of 300 nm or less, or (2) when the active radiation source used in the post-exposure step of a usual plate-making process comprises a wavelength range of 300 nm or less, the radiation with an active radiation for the purpose of the tackiness removal may be conducted simultaneously with the post-exposure by subjecting the plate after the development to the hydrogen-abstracting agent-impregnating treatment.

However, when an alcoholic solution of a hydrogen-abstracting agent is used as a surface-treating solution according to the above-mentioned method, the surface tackiness-removing effect is sufficiently recognized, but the above surface-treating solution has a flash point, and hence the handling thereof is difficult and the influence on the working efficiency and product cost is very great.

Moreover, JP-B-56-16,182 states that when the irradiation with an active radiation for the purpose of the removal of surface tackiness is effected in water, it is necessary to impregnate the surface of the cured product with a hydrogen-abstracting agent and thereafter removing the solvent component by drying. Therefore, as in the case of using a liquid photosensitive resin, it is general to conduct the post-exposure step in the plate-making by the post-exposure-in-water method, and when the surface tackiness-removing effect cannot be sufficiently expected in the post-exposure-in-air, it becomes necessary to provide a drying step before the post-exposure-in-water in order to carry out the above method (2), and expensive equipment such as an explosion-proof type dryer, a forced exhauster or the like must be newly provided.

DISCLOSURE OF THE INVENTION

This invention provides a surface-treating solution for a photosensitive resin printing plate for improving the handling of the treating solution and realizing the enhancement of productivity by a more effective surface tackiness removal, without going through the redundant plate-making work step of a conventional method for removing the surface tackiness as disclosed in JP-B-56-16,182, in which method the cross-linking reaction with a hydrogen-abstracting agent is utilized, and also provides a process for producing a photosensitive resin printing plate.

The present inventors have eagerly made research for solving such problems and have consequently obtained knowledge that an aqueous surface active agent solution containing a hydrogen-abstracting agent is useful as a surface-treating solution for a photosensitive resin printing plate that is aimed at removing the surface tackiness and that said aqueous solution can be handled similarly to water, on the basis of which knowledge this invention has been completed.

That is to say, one embodiment of this invention is a surface-treating solution for a photosensitive resin printing plate which comprises an aqueous surface active agent solution and a hydrogen-abstracting agent which can abstract a hydrogen atom of a compound upon irradiation with an active radiation.

Another embodiment of this invention is a process for producing a photosensitive resin printing plate which comprises a step of exposing a photosensitive resin printing original plate (exposure step), a step of developing the photosensitive resin printing original plate (development step), a step of subsequently treating the surface layer of the photosensitive resin cured product obtained with the above-mentioned surface-treating agent to impregnate the surface layer with the hydrogen-abstracting agent (hydrogen-abstracting agent-impregnation step) and an exposure step for subsequently irradiating the surface layer with an active radiation to remove the tackiness of the surface layer (tackiness-removing exposure step).

BEST MODE FOR CARRYING OUT THE INVENTION

The photosensitive resin to which this invention can be applied is not particularly limited; however, as preferable typical examples, the following (1) and (2) can be mentioned:

(1) A photosensitive resin comprising a prepolymer having at least one polymerizable double bond in the molecule, a photopolymerization initiator and an ethylenically unsaturated monomer having a polymerizable double bond.

As the prepolymer, there can be mentioned at least one kind of, for example, unsaturated polyesters, unsaturated polyurethanes, unsaturated polyamides, unsaturated polyacrylate resins, unsaturated polymethacrylate resins, various modification products thereof and the like. As such a photosensitive resin composition, there can be mentioned those described in JP-A-1-245,245; JP-A-3-157,657 and JP-A-55-034,930.

(2) A photosensitive rubber composition comprising an unvulcanized rubber, a monomer having an ethylenic double bond and a photopolymerization initiator (a so-called photosensitive elastomer).

There can be mentioned, for example, the photosensitive resin described in JP-A-5-134,410.

The surface-treating solution for a photosensitive resin printing plate which is an embodiment of this invention and characterized in that a hydrogen-abstracting agent is contained in an aqueous surface active agent solution is explained in detail below.

The surface-treating solution for a photosensitive resin printing plate of this invention is a liquid aimed at allowing a hydrogen-abstracting agent to be attached to and impregnated into the surface layer of a photosensitive resin cured product, and in this treating solution, the hydrogen-abstracting agent must be contained.

As the hydrogen-abstracting agent used in this invention, there are mentioned organic carbonyl compounds which can be excited upon irradiation with an active radiation and can abstract a hydrogen atom contained in the other compounds. In particular, such organic carbonyl compounds are appropriate to exhibit hydrogen-abstracting reactions of the same reactivity as or a higher reactivity than reactions other than the hydrogen-abstracting reaction in which the carbonyl group in the excited state participates, for example, the Norrish 1 type reaction where a carbonyl compound is split in the α-position under the irradiation with a light, or the Norrish 2 type reaction where a ketone having hydrogen to be abstracted at the γ-position of the carbonyl group is split into an olefin and a lower molecular weight ketone compound under irradiation with a light.

As typical organic carbonyl compounds which can be used as a hydrogen-abstracting agent in this invention, there are mentioned, for example, substituted or unsubstituted benzophenones such as benzophenone, methyl o-benzoylbenzoate, 4-phenylbenzophenone, 4-chlorobenzophenone, 4-hydroxybenzophenone, 4-benzoyl-4'-methyldiphenyl sulfide, 3,3'-dimethyl-4-methoxybenzophenone, 4,4'-dichlorobenzophenone, 4-methylbenzophenone and 4,4'-dimethoxybenzophenone;

substituted or unsubstituted acetophenones such as acetophenone, 4-methylacetophenone, 2,4- or 3,5-dimethylacetophenone, 4-methoxyacetophenone, 2-chloro-2-phenylacetophenone, 3,4-dichloroacetophenone, 4-hydroxyacetophenone and the like;

substituted or unsubstituted aromatic ketones such as benzoin; benzoin alkyl ethers, for example, benzoin methyl ether, benzoin ethyl ether, benzoin isopropyl ether, benzoin isobutyl ether and the like; deoxybenzoin; benzyl methyl ketal; benzil; 2-naphthyl phenyl ketone; and dibenzosuberone;

various o,p-quinone compounds such as 1,4-benzoquinone, 2,6-dimethyl-1,4-benzoquinone, 2,6-dichloro-1,4-benzoquinone, anthraquinone, 2-chloroanthraquinone, 2-methylanthraquinone, 2-ethylanthraquinone, 1,4-naphthoquinone, 2,3-dichloro-1,4-naphthoquinone, 2,3-dimethyl-1,4-naphthoquinone, 2-ethyl-1,4-naphthoquinone, phenanthrenequinone, 1,2-naphthoquinone and camphorquinone;

substituted or unsubstituted thioxanthones such as thioxanthone, 2-chlorothioxanthone, 2-methylthioxanthone, 2-isopropylthioxanthone, 2,4-dichlorothioxanthone, 2,4-dimethylthioxanthone and 2,4-diethylthioxanthone; and the like.

Preferably, the organic carbonyl compound has at least one substituted or unsubstituted aromatic ring bonded to the carbonyl carbon. Organic carbonyl compounds having a structure represented by the formula (I) or (II) shown below are effective as a hydrogen-abstracting agent in this invention. At least one of the compounds of the formula (I) or the formula (II) may be used; however, at least two hydrogen-abstracting agents may be used in combination.

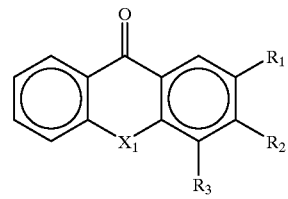

(I)

wherein $X_1$ represents sulfur (—S—), a carbonyl group (—CO—) or an ethylene group (—CH$_2$—CH$_2$—); and $R_1$, $R_2$ and R3 may be the same or different and each represents a hydrogen atom, an alkyl group having 1 to 5 carbon atoms, an alkoxyl group having 1 to 5 carbon atoms, a halogen atom selected from the group consisting of F, Cl, Br and I, a hydroxyalkyl group having 1 to 5 carbon atoms or a hydroxyalkoxyl group having 1 to 5 carbon atoms.

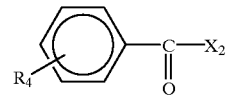

(II)

wherein $X_2$ represents a substituted or unsubstituted benzoyl group, phenyl group or naphthyl group represented by the following general formula (III), (IV) or (V), respectively, and $R_4$ represents a hydrogen atom, a halogen atom selected from the group consisting of F, Cl, Br and I, an alkoxyl group having 1 to 5 carbon atoms, a hydroxyl group, an alkyl group having 1 to 5 carbon atoms, a hydroxyalkyl group having 1 to 5 carbon atoms or a hydroxyalkoxyl group having 1 to 5 carbon atoms:

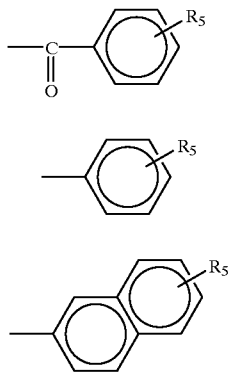

wherein $R_5$ represents a halogen atom selected from the group consisting of F, Cl, Br and I, a hydrogen atom, an alkyl group having 1 to 5 carbon atoms, an alkoxyl group having 1 to 5 carbon atoms, a hydroxyalkyl group having 1 to 5 carbon atoms or a hydroxyalkoxyl group having 1 to 5 carbon atoms.

Moreover, as a derivative of the compound of the formula (I) or the formula (II), a compound having a polymerizable double bond or an ammonium salt compound can also be used as the hydrogen-abstracting agent in this invention.

As such compounds, there are specifically mentioned benzophenone, 4,4'-dimethoxybenzophenone, 4-hydroxybenzophenone, anthraquinone, 2-methylanthraquinone, 2-ethylanthraquinone, 2,4-diethylthioxanthone, 2-chlorothioxanthone and the like.

As the ammonium salt derivative of the formula (I) or the formula (II), there are mentioned (2-acryloyloxy)(4-benzoylbenzyl)dimethylammonium bromide, (4-benzoylbenzyl) trimethylammonium chloride, 2-(3-dimethylamino-2-hydroxypropoxy)-3,4-dimethyl-9H-thioxanthon-9-one mesochloride and the like. Among them, benzophenone is most effective in respect of dispersibility, hydrogen-abstracting effect per unit weight or the like.

The hydrogen-abstracting agent being attached to and impregnated into the surface layer of a resin cured product by use of the surface-treating solution for a photosensitive resin printing plate is achieved by allowing the hydrogen-abstracting agent together with the solvent to be attached to and penetrate the surface layer of the resin cured product when the surface of the resin cured product is treated with the treating solution. Accordingly, in order for the hydrogen-abstracting agent to be efficiently and uniformly attached to and impregnated into the surface layer of the resin cured product in a simple manner, it is necessary that the hydrogen-abstracting agent be uniformly contained in the treating solution.

As the state required in this invention that the hydrogen-abstracting agent is uniformly contained in the treating solution, a solution state is optimum; however, the hydrogen-abstracting agent may be uniformly dispersed in the emulsion or suspension state. Speaking in detail, it means the state that the necessary amount of the hydrogen-abstracting agent does not settle nor surface. More practically, it means the state that when the treating solution is allowed to stand at the appropriate treatment temperature mentioned hereinafter, the necessary amount of the hydrogen-abstracting agent does not precipitate nor surface for at least 24 hours.

In this invention, the above-mentioned aromatic carbonyl compounds are excellent in hydrogen-abstracting reaction, except some of the ammonium salt compounds, are generally poor in water-solubility, so that a dispersibility in an aqueous solution is imparted to the hydrogen-abstracting agent by use of a surface active agent.

The surface active agent used in this invention may be any surfactant as far as it enables the hydrogen-abstracting agent to be contained uniformly, and the structure and properties thereof are not particularly limited.

In general, the surface active agent is classified into anionic surfactant, cationic surfactant, nonionic surfactant and amphoteric surfactant depending upon the types of ions. In this invention, each of them may be used alone or in combination of two or more, and it is particularly preferable to use an anionic surfactant or a nonionic surfactant which is for general purpose as the surface active agent. However, in order to obtain one of the effects of this invention, namely, such an effect that the aqueous solution can be handled similarly to water, the aqueous surface active agent solution obtained should not be such that it has a flash point, the storage thereof as an organic material is complicated or time is required for its disposal.

As typical surface active agents which can be used in this invention, there can be mentioned, for example, anionic surfactants such as salts of straight chain alkylbenzene-sulfonic acids, α-olefin sulfonic acids, dialkylsulfosuccinic acids, sulfonic acids of lower alkyl esters of fatty acids, alkylsulfuric acids, alkyl ether sulfuric acids, saturated or unsaturated fatty acids, etc. or their polyoxyalkylene adducts with alkali metals such as sodium, potassium, etc., ammonium and alkanolamines such as monoethanolamine, diethanolamine, etc.; and nonionic-surfactants such as polyoxyalkylene alkyl ethers, polyoxyalkylene alkenyl ethers, polyoxyalkylene alkyl phenyl ethers, polyoxyalkylene alkenyl phenyl ethers, polyoxyalkylene alkylamines, polyoxyalkylene alkenylamines, polyoxyalkylene alkylamides, polyoxyalkylene alkenylamides and ethylene oxide/propylene oxide block adducts (Pluronic type surfactants).

Nonionic surfactants are more preferable than anionic surfactants from the viewpoint of performance for allowing the hydrogen-abstracting agent to be uniformly contained in the aqueous solution, and in particular, in order to allow an aromatic carbonyl compound excellent in hydrogen-abstracting reactivity to be uniformly contained in the aqueous solution, preferable are aromatic polyethylene glycol type nonionic surfactants, a representative of which is polyoxyethylene nonyl phenyl ether.

In order to allow the hydrogen-abstracting agent to be efficiently attached to and impregnated into the cured product surface layer in a simple manner, it is preferable to use a surface active agent which easily penetrates the resin cured product. In the case of a surface-treating solution for a liquid photosensitive resin printing plate in which an aqueous surface active agent solution is generally used as a developer, it is effective to allow the surface active agent used as a washing component in the developer to be contained as a constituent of the surface-treating solution of this invention.

As to the amounts of the hydrogen-abstracting agent and the surface active agent contained in the treating solution, their preferable amounts are varied depending upon the compounds used, and the manner of and conditions for treating the surface of the resin cured product with the treating solution as mentioned herein-after; however, it is usually preferable to use the hydrogen-abstracting agent in an amount in the range of from 0.01 to 10 parts by weight and the surface active agent in an amount in the range of from 0.1 to 20 parts by weight, per 100 parts by weight of water. When the content of the hydrogen-abstracting agent is less than 0.01 parts by weight, no sufficient effect of surface tackiness removal can be expected, and when it is in a range exceeding 10 parts by weight, the uniformity in water becomes poor even when a large amount of the surface active agent is used. On the other hand, since when the surface active agent itself is attached to and impregnated into the surface layer of the resin cured product, it increases the tackiness in some cases, it is preferable to use the surface active agent in the minimum amount necessary for allowing the hydrogen-abstracting agent to be uniformly contained, and in order to make the content of the surface active agent as low as possible, it is desirable to use a surface active agent excellent in ability to allow the hydrogen-abstracting agent to be uniformly contained in the aqueous solution.

As to the surface-treating solution for a photosensitive resin printing plate of this invention, the following methods are mentioned as a mixing method for allowing the hydrogen-abstracting agent to be uniformly contained in the aqueous surface active agent solution.

When the hydrogen-abstracting agent used is relatively excellent in water-solubility and when the surface activating effect of the surface active agent is very large, it is not necessary to particularly pay attention to the mixing method; however, in order to more effectively conduct the uniform mixing with the surface active agent, it is preferable to introduce the necessary amount of the hydrogen-abstracting agent into an aqueous surface active agent solution which has previously been prepared at the given concentration and mix them.

However, many hydrogen-abstracting agents are normally solid or substantially or completely insoluble in water, and hence, a uniform mixing is difficult according to the above-mentioned method. In such a case, it is preferable to use a dilute solution obtained by uniformly mixing the hydrogen-abstracting agent in such a state that the surface activating effect is larger and then diluting the resulting mixture. Specifically, there is mentioned a method in which a solution or uniform dispersion of the necessary amount of the hydrogen-abstracting agent in the stock solution of surface active agent or an aqueous surface active agent solution having a high concentration is previously prepared and then diluted with water to the given amount, a method in which, if the treating solution can be used in such a range that it does not have a flash point, a solution of a hydrogen-abstracting agent in an alcohol or the like and an aqueous surface active agent solution are previously prepared and the two are mixed, and the like methods.

The surface-treating solution for a photosensitive resin printing plate of this invention can have compounded therewith, if necessary, any other components than the above-mentioned hydrogen-abstracting agent and surface active agent. Specifically, there are mentioned, for example, alkanolamines such as monoethanolamine, diethanolamine, triethanolamine and the like; builders such as citric acid salts, phosphoric acid salts, ethylenediaminetetraacetic acid salts and the like; glycols for keeping the liquid stability such as ethylene glycol, propylene glycol and the like; lower alcohols such as methanol, ethanol and the like; hydrotrops such as toluenesulfonic acid salts, xylenesulfonic acid salts and the like; anticorrosive agents such as benzotriazole and the like; antiseptics such as benzoic acid salts and the like; etc.

A detailed explanation is made below of a process for producing a photosensitive resin printing plate, characterized by treating the surface layer of a photosensitive resin printing plate obtained by exposure and development, with a surface-treating solution for a photosensitive resin printing plate and thereafter irradiating the said surface layer with an active radiation, which process is the other embodiment of this invention.

In order to obtain a non-tacky, photosensitive resin printing plate which is one of the effects of this invention, it is necessary that the surface of a resin (relief) cured product obtained by exposure and development be treated with the surface-treating agent for a photosensitive resin printing plate to allow the hydrogen-abstracting agent to be attached to and impregnated into the surface layer of the resin cured product (referred to hereinafter as the hydrogen-abstracting agent-impregnation step) and that the surface of the resin cured product to which the hydrogen-abstracting agent has been attached and into which the hydrogen-abstracting agent has been impregnated be irradiated with an active radiation to activate (excite) the hydrogen-abstracting agent, thereby causing a hydrogen-abstracting reaction (referred to hereinafter as the tackiness-removing exposure step).

The hydrogen-abstracting agent-impregnation step and the tackiness-removing exposure step are collectively referred to hereinafter as the surface-treatment step.

The process for producing a photosensitive resin printing plate of this invention is a production process in which the surface-treatment step is added to the four steps of exposure, development, post-exposure and drying which are mentioned as the general production steps for a photosensitive resin printing plate.

First of all, the four steps of exposure, development, post-exposure and drying which are generally carried out are explained.

The exposure step for a liquid photosensitive resin is carried out in combination with a molding operation for adjusting the liquid resin to a given thickness. An apparatus for carrying out such molding and exposure of a liquid photosensitive resin is called a plate-making machine.

The exposure step for a letterpress printing plate in the case of using a liquid photosensitive resin comprises carrying out successively (1) a molding step comprising placing a negative film on an ultraviolet-permeable glass plate, then covering the same with a thin protective film, thereafter casting a liquid photosensitive resin thereon, then laminating thereto a base film which becomes a support through a spacer so that the resin becomes a plate having a given thickness, and further pressing the resulting assembly from above by means of an ultraviolet-permeable glass plate, (2) a relief-forming exposure step in which the assembly is irradiated from the lower glass side through the negative film with an active radiation (having a wavelength distribution of 300 nm or more), the light source of which is an ultraviolet fluorescent lighting, to form an image and (3) a back exposure step in which the assembly is irradiated with the same active radiation as above from the upper glass side through the support for a short time to form a uniform, thin, cured resin layer, namely, a bottom-forming layer (a back layer) over the whole surface of the support side of the plate.

In the case of a printing plate of 4 mm or more in thickness as used in flexographic printing, it is general to form a shelf layer which becomes a base for supplementing the strength of the relief to the printing pressure during printing, and in this case, it is necessary to conduct a masking exposure using an exclusive negative film from the upper glass side before the relief exposure.

When a solid (sheet-like) photosensitive resin is used, since the sheet is a complex structure composed of a protective film layer, a protective membrane layer, a photosensitive layer formed in the given thickness, a base film (support) layer, the exposure step comprises carrying out successively (1) a back exposure step in which the solid (sheet-like) photosensitive resin is arranged on an ultraviolet permeable glass plate so that the support side thereof contacts therewith and is irradiated with an active radiation, the source of which is an ultraviolet fluorescent lighting, from the lower glass side and (2) a relief exposure step in which the protective film is peeled off and a negative film is intimately attached to the exposed protective membrane and the resulting assembly is irradiated from the lower side with the same active radiation as from the lower side, through the negative film.

Next, the development step is explained.

In the process for producing a letterpress printing plate using a photosensitive resin with the aim of relief formation by photography, a development step is required in order to remove printing plate portions other than the necessary relief image. In a general negative type photoreaction system, a liquid having an ability to allow the unreacted resin before exposure to dissolve therein or swell therewith is used as a developer. The photosensitive resin irradiated with a radiation loses its dissolvability in or swellability with the developer by a curing reaction (conversion to macromolecule, gelation), thereby forming on the printing surface a relief to which a resistance to developer has been imparted.

As the developer for the liquid photosensitive resin, an aqueous surface active agent solution is generally used, and as to the kind of the surface active agent and the composition of the aqueous solution, those are selected which are optimum for the properties of the resin used. As the developer for the solid (sheet-like) photosensitive resin, a 1,1,1-trichloroethane type solvent, a Perclene/butanol mixed solution or the like is used.

As the developing method, there is mentioned a method in which the exposed photosensitive resin plate is immersed in the developer, a method in which the developer is sprayed from a spray nozzle onto the surface of the exposed photosensitive resin plate to dissolve and remove the uncured resin, a method in which the unreacted resin swollen by immersion or spray is scratched with a brush, or the like.

Next, the post-exposure step is explained.

The post-exposure step in the plate-making process in the case of using a liquid photosensitive resin is a step of irradiating with an active radiation of the resin cured product after the development, aiming mainly at accelerating the mechanical strength and removing the surface tackiness. In this step, in many cases, an active radiation source having a wavelength distribution in a range of 300 nm or more which is used in the relief exposure (for example, high pressure mercury vapor lamp, ultra-high pressure mercury vapor lamp, ultraviolet fluorescent lighting, carbon arc lamp, xenon lamp or the like) and an active radiation source having a wavelength distribution in the range of from 200 to 300 nm (for example, low pressure mercury vapor lamp, germicidal lamp, deuterium lamp or the like) are used in combination.

The post-exposure step may be carried out by the post-exposure-in-water system in order to prevent the polymerization from being inhibited by oxygen in the air, or may be carried out by the exposure-in-air system in which no measurement is taken for the inhibition of the polymerization reaction by oxygen. In the case of a liquid photosensitive resin, as a more effective post-exposure method, there is generally used the post-exposure-in-water system.

In the post-exposure step in the plate-making process in the case of use of a solid (sheet-like) photosensitive resin, generally irradiation with an active radiation having a distribution of wavelength in the range of from 200 to 300 nm is effected by the post-exposure-in-air system for the purpose of removing the surface tackiness.

The drying step is carried out to dry the water attached to the surface of the photosensitive resin plate in the development step, the post-exposure-in-water step and the like, and there is generally used an exclusive hot air drying machine capable of containing a printing plate.

Moreover, after the development, for the purpose of removing the developer attached to the printing plate surface, a step of washing the printing plate surface with water, a so-called rinse step, may be added.

A developing apparatus which is generally commercially available is provided with a rinsing function in addition to a developing function, and in many cases, it has a mechanism by which the rinsing liquid after the rinsing is sent to a developer-storing tank and mixed with the developer. In this case, as the rinsing liquid, it is necessary to use one that will not lower the performance of the developer.

The above-mentioned four steps are merely an example of a plate-making which is generally carried out, and in this invention, any type of each of the four steps can be practiced as far as it satisfies the requirements for treating the plate which are necessary for its working.

In the process for producing a photosensitive resin printing plate of this invention, among the exposure step (including the molding step before the exposure), the development step, the post-exposure step and the drying step which are generally carried out, after the exposure step and the development steps, a surface-treating step consisting of a hydrogen-abstracting agent-impregnation step and a tackiness-removing exposure step is effected.

Each of the steps included in the surface-treating step in this invention is explained below in detail.

The hydrogen-abstracting agent-impregnation step is a treatment step aiming at treating the surface of the resin cured product with the above-mentioned surface-treating solution for a photosensitive resin printing plate to allow the hydrogen-abstracting agent contained in the above treating solution to be attached to and impregnated into the surface layer of the resin cured product.

In order to evenly remove the tackiness of the printing plate surface, it is necessary to uniformly treat the whole surface of the photosensitive resin cured product with the above treating solution. As a specific method therefor, there is mentioned a method which comprises introducing the resin cured product into the surface-treating solution and immersing the former in the latter, a method which comprises spraying the surface-treating solution from a spray nozzle to the surface of the resin cured product, a method which comprises brushing the surface-treating solution on the surface of the resin cured product, or the like. Among them, the method which comprises spraying the surface-treating solution from a spray nozzle is most effective.

In this invention, since an aqueous surface active agent solution is used as the above treating solution, even in the case of the above-mentioned method, no attention is necessary to pay to working environment and safety such as setting of explosion-proof equipment and local exhaust apparatus and the like which are required when a flammable solvent is used. This is one of the effects of this invention.

In each of the above methods, the amount of the hydrogen-abstracting agent impregnated into the surface of the resin cured product is varied depending upon the temperature of the treating solution, the immersion or spray time of the treating solution and the number of brushings with the treating-solution, and the surface tackiness-removing effect is correspondingly varied. When the liquid temperature is elevated, the uniformity of the hydrogen-abstracting agent in the aqueous solution is improved, and the degree of swelling of the surface of the resin cured product becomes large, so that the amount of the hydrogen-abstracting agent impregnated tends to be increased. However, from the viewpoint of liquid stability and workability, it is preferable that the liquid temperature is maintained constant at 20–60° C. Moreover, a longer immersion or spray time or a larger number of brushings is advantageous for the impregnation with the hydrogen-abstracting agent; however, there is a limit in the concentration of the hydrogen-abstracting agent impregnated into the surface layer of the resin cured product and hence it is preferable to optimize the amount of the hydrogen-abstracting agent contained in the treating solution while taking workability into consideration.

For example, when an aqueous solution satisfying the above-mentioned amount of the hydrogen-abstracting agent contained in the surface-treating solution for a photosensitive resin printing plate is used, a sufficient effect on surface tackiness removal appears when the immersion or spray time is about 10 minutes and the number of brushings is 5 more or less.

In order to keep a stabilized surface tackiness-removing effect in the continuous plate-making, it is necessary to keep the amount of the hydrogen-abstracting agent impregnated into the surface layer of the resin cured product at a value not lower than the given value, and for this purpose, it is important to find the above-mentioned step conditions and the optimum conditions for the amount of the hydrogen-abstracting agent contained in the treating solution.

The tackiness-removing exposure step is a step aiming at activating (exciting) the hydrogen-abstracting agent by irradiating with an active radiation the surface of the resin cured product to which the hydrogen-abstracting agent has been attached to and into which the hydrogen-abstracting agent has been impregnated, thereby causing a hydrogen-abstracting reaction. The hydrogen-abstracting agent activated by the irradiation with an active radiation abstracts hydrogen of the main chain of a prepolymer reacted with the unreacted monomer or another prepolymer at the terminal double bond to thereby produce a radical of the prepolymer. The resulting prepolymer radicals are bonded to one another to form a three-dimensional cross-linkage, and as a result, the tackiness of the resin cured product surface is removed. The active radiation therefor is required to have a wavelength in such a wavelength range that the hydrogen-abstracting agent is efficiently excited, and if this condition is satisfied, the wavelength of the active radiation is not particularly limited. When the above-mentioned organic carbonyl compound is used as the hydrogen-abstracting agent, it is particularly preferable to use an ultraviolet ray having a wavelength distribution in a short wavelength range of 300 nm or less. However, when the irradiation with an active radiation having a wavelength of 200 nm or less is effected in air, the generation of ozone and the oxidization of the resin cured product therewith cannot be neglected, and hence, an active radiation having a wavelength distribution in the range of from 200 to 300 nm is preferred.

The appropriate exposure dose for obtaining a sufficient surface tackiness-removing effect is varied depending upon the resin composition of the resin cured product, the kind of the hydrogen-abstracting agent and the amount of the hydrogen-abstracting agent impregnated relative to the resin composition; however, it is at least 500 mJ/cm$^2$ (a value calculated from the exposure dose and the exposure time at a wavelength of 250 nm as measured by an ultraviolet radiation dosimeter manufactured by ORC Seisakusho, UV-M02), and the range of from 1,000 to 5,000 mJ/cm$^2$ is preferable. The exposure dose of not less than 5,000 mJ/cm$^2$ is not desirable because fine cracks are caused on the printing plate surface.

Moreover, the tackiness-removing exposure in this invention gives a tackiness-removing effect even when it is effected by either the exposure-in-water system or the exposure-in-air system which are general as the post-exposure method.

In the process for producing a photosensitive resin printing plate of this invention, as mentioned above, among the steps of exposure (including molding step), development, post-exposure and drying, after the steps of exposure (including molding step) and development, a surface-treatment step consisting of a hydrogen-abstracting agent-impregnation step and a tackiness-removing exposure step is carried out. The surface-treatment step may be carried out in any stage as far as it is after the exposure and development steps.

For example, by incorporating into the plate-making method the surface-treatment step consisting of the hydrogen-abstracting agent-impregnation step and the tackiness-removing exposure step at a stage as mentioned below, the non-tacky photosensitive resin printing plate of this invention can be obtained:

Method 1: Exposure—development—post-exposure—hydrogen-abstracting agent-impregnation—tackiness-removing exposure—drying Method 2: Exposure—development—hydrogen-abstracting agent-impregnation—tackiness-removing exposure (including post-exposure)—drying Method 1 is a method in which the surface-treatment is effected after the post-exposure step, and the surface-treatment is applied to a plate which has been subjected to the usual plate-making process throughout.

Method 2 is a method in which the surface-treatment step is carried out after the development step. In this case, in a liquid photosensitive resin, together with an active radiation for activating (exciting) the hydrogen-abstracting agent, there is used an active radiation having a wavelength distribution in a range of 300 nm or more, thereby enabling both the tackiness-removing exposure and the post-exposure to be simultaneously conducted, and as a result, an increase of the mechanical strength of the cured product which is the purpose of the post-exposure step is simultaneously obtained.

As compared with Method 1, Method 2 is small in the number of plate-making steps and small in adverse influence on production costs, and in addition, the tackiness removal is effected more effectively by impregnating the plate surface with the hydrogen-abstracting agent after the development, so that it is preferable.

In addition, in the case of the production process in which a rinse step is provided after the development step, the use of the treating solution of this invention as a rinse enables the hydrogen-abstracting agent-impregnation step to be carried out as the rinse step, so that the production of a printing plate is made possible without increasing the substantial number of plate-making steps.

However, when the tackiness-removing exposure step including the post-exposure is carried out by an exposure-in-air system in Method 2, the printing plate obtained is sufficiently freed of tackiness on the surface of the image portion to be subjected to printing, namely, the convex portion surface obtained by the relief exposure; but in some cases, it is not sufficiently freed of tackiness on the surfaces of the shelf layer and back layer when formed by the exposure to light from the support side in order to improve printability and handleability. This phenomenon is particularly remarkable with the liquid photosensitive resin. The degree that the surface tackiness of the shelf layer and back layer causes attachment of paper powder, paper-picking or the like is small and a practically usable printing plate can be obtained; however, the exposure-in-water system is preferred in order to remove tackiness throughout the plate surface.

In the plate-making process of this invention in which the exposure-in-water system is used, the post-exposure-in-water can be carried out after the hydrogen-abstracting agent-impregnation step without providing a drying step, so that the plate-making process can be simplified. On the other hand, according to the method of JP-B-56-16,182 in which an alcoholic solution of a hydrogen-abstracting agent is used, unless the post-exposure-in-water is effected after the drying step, it follows that the hydrogen-abstracting agent on the plate surface is deposited into water, and the surface tackiness removal is not achieved.

Furthermore, when the aqueous surface active agent solution containing the hydrogen-abstracting agent is compared with the alcoholic solution of the hydrogen-abstracting agent as to the tackiness-removing ability of the surface-treating solution for a photosensitive resin printing plate of this invention, the aqueous surface active agent solution is largest in its surface tackiness-removing effect. The reason why a difference in the surface tackiness-removing effect is caused between such two solutions is not clear; however, it is known that with the alcoholic solution, the amount of the resin component extracted from the cured resin surface is large. From this, it is inferred that the use of the aqueous surface active agent solution does not result in extraction of the resin component unlike the use of the alcoholic solution, and these components can participate in the cross-linking reaction due to the hydrogen-abstracting reaction, so that a more effective surface tackiness-removing effect is obtained. Furthermore, in the surface active agent, there is present a large amount of a compound having a higher hydrogen-abstracting reactivity, namely, a compound excellent in ability as a hydrogen-donor, such as an alkylene oxide or the like, and when such a compound is used, the surface active agent impregnated together with the hydrogen-abstracting agent into the surface layer of the resin cured product is considered to participate in the cross-linking reaction.

When the treating solution of this invention has an ability to develop the photosensitive resin, the use of the treating solution of this invention as the developer enables a printing plate to be produced by carrying out the developing step and the hydrogen-abstracting agent-impregnation step in one and the same step.

The evaluation of the tackiness of the surface of a printing plate has been conducted by use of a tack tester (manufactured by Toyo Seiki Co., Ltd.) in which a polyethylene film laminated to the peripheral surface of an aluminum ring having a diameter of 50 mm and a width of 13 mm is contacted with the relief surface layer, the resulting assembly is allowed to stand under a load of 500 g applied to the aluminum ring for 4 seconds, thereafter, the aluminum ring is pulled up at a rate of 30 mm per minute and the tack when the aluminum ring separates from the relief surface is read by a push-pull gauge. It can be said that when the value of the tack tester (referred to hereinafter as merely the tack value) is smaller, the surface tackiness is smaller. However, in the evaluation of a permanent tackiness, in the state that such a coating layer as to be peeled off during printing is not present, that is to say, after a compound for the purpose of removing the surface tackiness, if contained in the photosensitive resin composition, has been removed from the composition, the tackiness of the photosensitive resin substrate must be measured.

In the case of a printing plate having a tack value exceeding about 50 g, foreign matter attaches to the printing plate surface and results in a failure on a printed matter. Moreover, when printing plates each having a weight of more than 100 g are placed in a pile they adhere to one another and when the matter to be printed is a paper, a paper-picking phenomenon is caused based on tack between the printing surface and the paper. As a good printing plate, it is desirable that the tack value is 0 g; however, when the tack value is not more than 30 g, it is considered that a problem resulting from tackiness cannot be caused in practice. In the case of a liquid photosensitive resin printing plate which is considered to be particularly inferior in tackiness among the printing plates, the tack value generally exceeds 100 g unless it is subjected to any treatment for removing the surface tackiness.

This invention is further explained below in more detail based on Examples and Comparative Examples; however, this invention should not be construed to be limited to these Examples.

In carrying out this invention, there were used two kinds of the liquid photosensitive resin composition A obtained in Example 1 of JP-A-1-245,245 (use of a polyether type unsaturated polyurethane polymer) and the liquid photosensitive resin composition B obtained in Example 3 of JP-A-3-157,657 (use of a polyether/polyester type unsaturated polyurethane polymer).

The compositions of the surface-treating solutions for photosensitive resin printing plates used in carrying out this invention are shown in Table 1.

Printing plates were produced according to the production processes shown in Examples 1 to 13 and Comparative Examples 1 to 10 in Table 2 using the liquid photosensitive resin compositions A and B.

In Table 2, for comparison of each example, only characteristic conditions are extracted and shown; however, the basic operation in each step is as shown in the following (1) to (6):

(1) Exposure step (including molding step)

A photosensitive resin composition was exposure-molded in a Model ALF-213E plate-making machine (manufactured by Asahi Kasei Kogyo Kabushiki Kaisha) to prepare a 7-mm plate. The exposure dose was at appropriate exposure conditions such that a relief depth of 2 mm, a shelf layer of 5 mm in thickness, a back layer of 1 mm in thickness, 65 lines/inch and 3% highlight formation were made possible.

(2) Development step

As a developer, there was used an aqueous solution containing 2% of APR (registered trade mark) washing-out agent Type W-8 (main reagent: use of anionic surfactant, manufactured by Asahi Kasei Kogyo Kabushiki Kaisha) which could emulsify the photosensitive resin composition and 0.3% of a defoaming agent SH-4 (silicone mixture, manufactured by Asahi Kasei Kogyo Kabushiki Kaisha), and using a Model AL-400W developing machine (drum rotary spray system, manufactured by Asahi Kasei Kogyo Kabushiki Kaisha, number of revolutions of drum: 20 revolutions/min, spray pressure: 1.5 Kgf/cm$^2$), a 7-mm plate which had been subjected to treatments until the exposure step, was developed at a liquid temperature of 40° C. for a development time of 10 minutes and the plate was washed (rinsed) with tap water to such an extent that bubbles resulting from the developer were removed.

(3) Post-exposure step

Using a Model AL-200UP post-exposing machine equipped with both ultraviolet fluorescent lighting and a germicidal lamp (manufactured by Asahi Kasei Kogyo Kabushiki Kaisha), post-exposure was conducted by an exposure-in-water system in which a bath was filled with water and a resin cured product was immersed therein and then exposed to light or an exposure-in-air system in which exposure to light was effected without storing water.

The exposure dose put into practice was as shown in Table 2.

(4) Hydrogen-abstracting agent-impregnation step

As the surface-treating solution, various compositions shown in Table 1 were used and the impregnation was conducted (1) by a spray-spraying system which was effected by the same Model AL-400W developing machine as used in the development (in Table 2, shown as "Spray") or (2) a system in which the resin cured product was immersed in the constant temperature bath of the above developing machine (in Table 2, shown as "Immersion". Thereafter, the plate was washed with tap water to such an extent that bubbles resulting from the treating solution were removed.

(5) Tackiness-removing exposure step

Carried out in the same manner as in the post-exposure step.

(6) Drying step

In a Model AL-100P dryer (manufactured by Asahi Kasei Kogyo Kabushiki Kaisha), the plate was dried for about 30 minutes until the water content on the plate surface became nil.

The evaluation of the tackiness of the plate obtained was conducted after the printing plate temperature became constant at about 20° C., (1) by measuring the tack after the image surface to be subjected to printing (the printing image surface) had been wiped with a fabric infiltrated with ethyl alcohol and the ethyl alcohol had been volatilized and (2) by touch evaluation of the back layer and shelf layer, and the results obtained are shown in Table 3.

Incidentally, in Comparative Example 9, good surface treatment was conducted, but an organic solvent (the flash point of ethanol was 13° C.) was used, so that from the viewpoint of hanldeability and working environment, the practical plate-making equipment requires a great improvement in equipment such as making apparatus explosion proof, installation of various exhausters, and the like.

Industrial Applicability

The surface-treating solution for a photosensitive resin printing plate according to this invention is aqueous, and hence, is excellent in handleability and applicable without making a great equipment improvement in the plate-making system of a liquid photosensitive resin in which plate-making with an aqueous treating solution is made the basis. Moreover, it is less expensive than the conventional hydrogen-abstracting agent solution in which an organic solvent is used and, in addition, superior in surface tackiness removability, so that the cost for the surface-treating solution can be greatly reduced.

In the photosensitive resin plate obtained by the process for producing a photosensitive resin printing plate according to this invention, no tackiness appears on the plate surface before and after the printing and during the printing, and no foreign matter is attached to the plate surface after the plate-making, during the printing or during storing of the plate, so that no working such as wiping the plate surface or the like is required to be made, and the workability is substantially the same as when a rubber plate is used.

TABLE 1

Surface-treating solution for photosensitive resin printing plate

| | Hydrogen-abstracting agent compound | Content (wt. %) | Surface active agent Trade name | Surface active agent Component | Content (wt. %) | Solvent |
|---|---|---|---|---|---|---|
| Surface-treating solution A | Benzophenone | 0.1 | Eleminol HB-29 (manufactured by Sanyo Chemical Industries, Limited) | Polyoxy-ethylene-polybenzyl phenyl ether | 0.5 | Water |
| Surface-treating solution B | Benzophenone | 0.1 | Nonipol 120 (manufactured by Sanyo Chemical Industries, Limited) | Polyoxy-ethylene nonyl phenyl ether (n = 12) | 1.0 | Water |
| Surface-treating solution C | Benzophenone | 0.1 | Emulmin 60 (manufactured by Sanyo Chemical Industries, Limited) | Polyoxy-ethylene alkyl ether (n = 6) | 1.5 | Water |
| Surface-treating solution D | Benzophenone | 0.1 | Washing-out agent W-8 (manufactured by Asahi Kasei Kogyo K.K.) benzenesulfonic acid salt as main component | Washing-out agent for APR comprising straight chain alkyl- | 2.0 | Water |
| Surface-treating solution E | Benzophenone | 0.1 | | None | | Ethanol |
| Surface-treating solution F | Benzophenone | 1.0 | | None | | Ethanol |

Note:
n is the number of moles of ethylene oxide added.

TABLE 2

Plate-making conditions
Production process (carried out in the right direction)

| | Molding exposure | Development | Post-exposure System | Post-exposure Exposure dose (GL/CL) (mJ/mJ) | Surface treatment Hydrogen-abstracting agent impregnation Treating solution | Surface treatment Hydrogen-abstracting agent impregnation System | Surface treatment Hydrogen-abstracting agent impregnation Time (min) | Tackiness-removing exposure System | Tackiness-removing exposure Exposure dose (GL/CL) (mJ/mJ) | Drying |
|---|---|---|---|---|---|---|---|---|---|---|
| Example 1 | ○ | ○ | — | — | A | Spray | 10 | In water | 2500/2500 | ○ |
| Example 2 | ○ | ○ | — | — | B | Spray | 10 | In water | 2500/2500 | ○ |
| Example 3 | ○ | ○ | — | — | C | Spray | 10 | In water | 2500/2500 | ○ |
| Example 4 | ○ | ○ | — | — | D | Spray | 10 | In water | 2500/2500 | ○ |
| Example 5 | ○ | ○ | — | — | A | Immersion | 10 | In water | 2500/2500 | ○ |
| Example 6 | ○ | ○ | — | — | A | Spray | 10 | In air | 2500/2500 | ○ |
| Example 7 | ○ | ○ | — | — | A | Immersion | 10 | In air | 2500/2500 | ○ |
| Example 8 | ○ | ○ | In water | 2500/2500 | A | Spray | 10 | In water | 1000/— | ○ |
| Example 9 | ○ | ○ | In water | 2500/2500 | A | Spray | 10 | In air | 1000/— | ○ |
| Example 10 | ○ | ○ | In water | 2500/2500 | A | Immersion | 10 | In air | 1000/— | ○ |
| Example 11 | ○ | ○ | In air | 2500/2500 | A | Spray | 10 | In air | 1000/— | ○ |
| Example 12 | ○ | ○ | In air | 2500/2500 | A | Immersion | 10 | In water | 1000/— | ○ |
| Example 13 | ○ | ○ | — | — | A | Spray | 10 | In air | 2500/— | ○ |
| Comparative Ex. 1 | ○ | ○ | In water | 2500/2500 | — | — | — | — | — | ○ |
| Comparative Ex. 2 | ○ | ○ | In air | 2500/2500 | — | — | — | — | — | ○ |
| Comparative Ex. 3 | ○ | ○ | In water | 2500/2500 | — | — | — | In air | 1000/— | ○ |
| Comparative Ex. 4 | ○ | ○ | In air | 2500/2500 | — | — | — | In air | 1000/— | ○ |
| Comparative Ex. 5 | ○ | ○ | In water | 2500/2500 | A | Spray | 10 | — | — | ○ |
| Comparative Ex. 6 | ○ | ○ | — | — | A | Spray | 10 | In water | —/2500 | ○ |
| Comparative Ex. 7 | ○ | ○ | — | — | F | Immersion | 10 | In air | 2500/2500 | ○ |
| Comparative Ex. 8 | ○ | ○ | — | — | F | Immersion | 10 | In air | 2500/2500 | ○ |

TABLE 2-continued

Plate-making conditions
Production process (carried out in the right direction)

| | | | Surface treatment | | | | | | |
|---|---|---|---|---|---|---|---|---|---|
| | | Post-exposure | | Hydrogen-abstracting agent impregnation | | | Tackiness-removing exposure | | |
| | | | Exposure dose | | | | | Exposure dose | |
| | Molding exposure | Development | System | (GL/CL) (mJ/mJ) | Treating solution | System | Time (min) | System | (GL/CL) (mJ/mJ) | Drying |
| Comparative Ex. 9 | ○ | ○ | In water | 2500/2500 | F | Immersion | 10 | In air | 1000/— | ○ |
| Comparative Ex. 10 | ○ | ○ | — | — | E | Immersion | 10 | In water | Discontinued because of opacification | |

Note:
1) "—" means unpracticed work and "○" and items stated as the experiment conditions mean practiced work.
2) In the item of surface-treating solution, composition name used in each example is stated and as to details of each composition, see Table 1.
3) "GL/CL" is an abbreviation of "germicidal lamp/ultraviolet fluorescent lighting". The unit area of mJ is $cm^2$.

TABLE 3

Tackiness evaluation results

| | Tackiness evaluation | | | |
|---|---|---|---|---|
| | Liquid photosensitive resin composition A | | Liquid photosensitive resin composition B | |
| | Printing image surface tack (g) | B/S layer | Printing image surface tack (g) | B/S layer |
| Example 1 | 0 | ○ | 0 | ○ |
| Example 2 | 0 | ○ | 0 | ○ |
| Example 3 | 0 | ○ | 0 | ○ |
| Example 4 | 0 | ○ | 0 | ○ |
| Example 5 | 10 | ○ | 20 | ○ |
| Example 6 | 10 | Δ | 10 | Δ |
| Example 7 | 0 | Δ | 50 | Δ |
| Example 8 | 0 | ○ | 10 | ○ |
| Example 9 | 0 | ○ | 10 | ○ |
| Example 10 | 10 | ○ | 40 | ○ |
| Example 11 | 10 | ○ | 20 | ○ |
| Example 12 | 0 | ○ | 50 | ○ |
| Example 13 | 0 | ○ | 0 | ○ |
| Comp. Ex. 1 | 110 | Δ | 410 | ΔX |
| Comp. Ex. 2 | 250 | X | 570 | X |
| Comp. Ex. 3 | 150 | Δ | 450 | ΔX |
| Comp. Ex. 4 | 290 | ΔX | 560 | X |
| Comp. Ex. 5 | 80 | Δ | 360 | ΔX |
| Comp. Ex. 6 | 250 | Δ | 550 | ΔX |
| Comp. Ex. 7 | 410 | X | 630 | X |
| Comp. Ex. 8 | 300 | Δ | 550 | ΔX |
| Comp. Ex. 9 | 0 | ○ | 50 | ○ |
| Comp. Ex. 10 | — | — | — | — |

Note:
1) B/S layer touch means the result obtained by evaluation by touch of tackiness of back layer and shelf layer. (Good) ○ > ○Δ > Δ > ΔX > X (Bad)

We claim:
1. A process for producing a photosensitive resin printing plate which comprises the following steps:
   a) an exposure step comprising exposing to light the original photosensitive resin printing plate;
   b) a development step comprising developing the original photosensitive resin plate to obtain a cured photosensitive resin product;
   c) a hydrogen-abstracting agent-impregnation step comprising treating a surface layer of the cured photosensitive resin product with a surface-treating solution to impregnate the surface layer with a hydrogen-abstracting agent, wherein the surface treating solution consists essentially of an aqueous surface active agent solution and a hydrogen-abstracting agent which can abstract a hydrogen atom of a compound upon irradiation; and
   d) a tackiness-removing exposure step comprising irradiating the surface layer with an active radiation, whereby the tackiness of the surface layer is removed.
2. The process according to claim 1, wherein the hydrogen-abstracting agent is an organic carbonyl compound.
3. The process according to claim 2, wherein the organic carbonyl compound is at least one member selected from the group consisting of compounds represented by the following formulas (I) and (II):

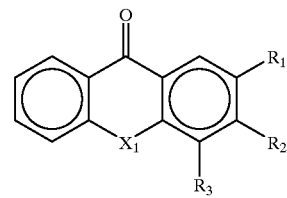

(I)

wherein $X_1$ represents sulfur (—S—), carbonyl group (—CO—), or ethylene group (—$CH_2$—$CH_2$—); and $R_1$, $R_2$ and $R_3$ may be the same or different and each represents a hydrogen atom, an alkyl group having 1 to 5 carbon atoms, an alkoxyl group having 1 to 5 carbon atoms, a halogen atom selected from the group consisting of F, Cl, Br and I, a hydroxyalkyl group having 1 to 5 carbon atoms or a hydroxyalkoxyl group having 1 to 5 carbon atoms,

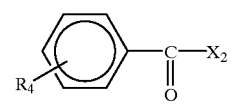

(II)

wherein $X_2$ represents a substituted or unsubstituted benzoyl group, phenyl group or naphthyl group represented by the following general formula (III), (IV) or (V), respectively:

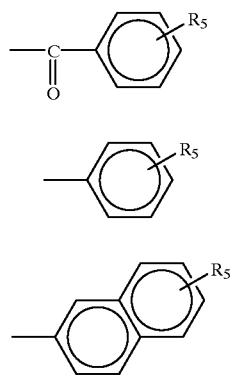

in which R₅ represents a halogen atom selected from the group consisting of F, Cl, Br and I, a hydrogen atom, an alkyl group having 1 to 5 carbon atoms, an alkoxyl group having 1 to 5 carbon atoms, a hydroxyalkyl group having 1 to 5 carbon atoms or a hydroxyalkoxyl group having 1 to 5 carbon atoms; and R₄ represents a hydrogen atom, a halogen atom selected from the group consisting of F, Cl, Br and I, an alkoxyl group having 1 to 5 carbon atoms, a hydroxyl group, an alkyl group having 1 to 5 carbon atoms, a hydroxyalkyl group having 1 to 5 carbon atoms or a hydroxyalkoxyl group having 1 to 5 carbon atoms.

4. The process according to claim 2, wherein the surface active agent is a nonionic surfactant.

5. The process according to claim 3, wherein the surface active agent is an aromatic polyethylene glycol nonionic surfactant.

6. The process according to claim 1, further comprising:
a post-exposure step comprising irradiating the surface of the photosensitive resin printing plate, the post-exposure step being performed subsequent to the development step; and
a drying step comprising drying the cured photosensitive resin product, the drying step being performed subsequent to the tackiness-removing exposure step.

7. The process according to claim 1, further comprising:
a post-exposure step comprising irradiating the surface of the photosensitive resin printing plate, the post-exposure step being performed simultaneously with the tackiness-removing exposure step.

8. The process according to claim 1, wherein the radiation has an exposure dose of about 500 to 5,000 mJ/cm².

9. The process according to claim 1, wherein the radiation is provided by a low pressure mercury vapor lamp, a germicidal lamp or a deuterium lamp.

10. The process according to claim 2, wherein the organic carbonyl compound is at least one selected from the group consisting of benzophenone, 4,4'-dimethoxybenzophenone, 4-hydroxybenzophenone, anthraquinone, 2-methylanthraquinone, 2-ethylanthraquinone, 2,4-diethylthioxanthone, 2-chlorothioxanthone, 2-acryloyloxy (4-benzoylbenzyl)dimethylammonium bromide, (4-benzoylbenzyl)trimethylammonium chloride, and 2-(3-dimethylamino-2-hydroxypropoxy)-3,4-dimethyl-9H-thioxanthon-9-one mesochloride.

11. The process according to claim 1, wherein the surface active agent is at least one selected from the group consisting of polyoxyalkylene alkyl ethers, polyoxyalkylene alkenyl ethers, polyoxyalkylene alkyl phenyl ethers, polyoxyalkylene alkenyl phenyl ethers, polyoxlyalkylene alkylamines, polyoxyalkylene alkenylamines, polyoxyalkylene alkylamides, polyoxyalkylene alkyenylamides and ethylene oxide/propylene oxide block adducts.

12. The process according to claim 1, wherein the surface active agent is polyoxyethylene nonyl phenyl ether.

13. The process according to claim 1, wherein the hydrogen-abstracting agent is present in an amount of from 0.01 to 10 parts by weight per 100 parts by weight of water in the surface treating solution.

14. The process according to claim 1, wherein the surface active agent is present in an amount of from 0.1 to 20 parts by weight per 100 parts by weight of water in the surface treating solution.

* * * * *